(12) United States Patent
Kim et al.

(10) Patent No.: US 12,532,695 B2
(45) Date of Patent: Jan. 20, 2026

(54) APPARATUS FOR TREATING A SUBSTRATE AND ELECTROSTATIC MONITORING METHOD OF TREATMENT LIQUID

(71) Applicant: SEMES CO., LTD., Cheonan-si (KR)

(72) Inventors: Do Yeon Kim, Yongin-si (KR); Young Jun Son, Cheonan-si (KR); Tae Hoon Lee, Osan-si (KR); Sung-gyu Lee, Cheonan-si (KR); Hyun Yoon, Seoul (KR)

(73) Assignee: Semes Co., LTD., Chungcheongnam-do (KR)

( * ) Notice: Subject to any disclaimer, the term of this patent is extended or adjusted under 35 U.S.C. 154(b) by 276 days.

(21) Appl. No.: 18/146,723

(22) Filed: Dec. 27, 2022

(65) Prior Publication Data
US 2023/0207341 A1  Jun. 29, 2023

(30) Foreign Application Priority Data

Dec. 27, 2021  (KR) .................. 10-2021-0189020
Mar. 29, 2022  (KR) .................. 10-2022-0039073

(51) Int. Cl.
*H01L 21/67*  (2006.01)

(52) U.S. Cl.
CPC .... *H01L 21/67051* (2013.01); *H01L 21/6715* (2013.01); *H01L 21/67242* (2013.01)

(58) Field of Classification Search
CPC .......... H01L 21/67051; H01L 21/6708; H01L 21/6715; H01L 21/67242; B08B 1/50; B08B 1/52
See application file for complete search history.

(56) References Cited

U.S. PATENT DOCUMENTS

2020/0168478 A1\*  5/2020  Jung .................. H05F 3/00
2021/0276031 A1\*  9/2021  Iino .................. G01N 27/07
2021/0327728 A1\* 10/2021  Hashimoto ....... H01L 21/67253

FOREIGN PATENT DOCUMENTS

KR          102139603 B1     7/2020
KR     10-2021-0113950 A     9/2021

\* cited by examiner

*Primary Examiner* — David G Cormier
(74) *Attorney, Agent, or Firm* — Harness, Dickey & Pierce, P.L.C.

(57) ABSTRACT

Provided is an apparatus for treating a substrate. The substrate treating apparatus may include: a substrate support unit supporting a substrate; a nozzle supplying a liquid to the substrate supported on the substrate support unit; a home port in which the nozzle waits; and an electrostatic measurement member measuring an electrostatic amount of a liquid dispensed from the nozzle in the home port.

13 Claims, 12 Drawing Sheets

810(820,830)

APPARATUS FOR TREATING A SUBSTRATE AND ELECTROSTATIC MONITORING METHOD OF TREATMENT LIQUID

CROSS-REFERENCE TO RELATED APPLICATIONS

This application claims priority to and the benefit of Korean Patent Application Nos. 10-2021-0189020 and 10-2022-0039073 filed in the Korean Intellectual Property Office on Dec. 27, 2021 and Mar. 29, 2022, the entire contents of which are incorporated herein by reference.

TECHNICAL FIELD

The present invention relates to an apparatus for treating a substrate and an electrostatic monitoring method of a treatment liquid.

BACKGROUND ART

A single wafer type liquid treating apparatus used for a semiconductor manufacturing process is configured to eject a treatment liquid from a nozzle to the surface of a substrate held on a spin chuck, for example.

A liquid treatment may include a treatment of applying a resist liquid to the substrate to form a resist pattern, a treatment of supplying a development liquid to the substrate after exposure, or a treatment of cleaning the substrate by supplying a rinse liquid to the substrate. The treatment liquid is supplied to the nozzle via a pipe in which a device such as a valve, a filter, a pump, etc., are provided in the middle of the supply.

A flow path including the pipe or the device is made of an insulating material such as a fluorine resin from the viewpoint of cleanness or chemical resistance. When the treatment liquid passes through the flow path (e.g., the pipe, etc.), static electricity is generated by the friction between the treatment liquid and an internal surface of the flow path, and the treatment liquid is charged. A charging amount of the treatment liquid may increase according to the type of treatment liquid or a process condition, and a damage due to a static electricity breakage of a member constituting the flow path or performance degradation of a treating process is concerned. In particular, when a treatment liquid having a large charging amount is supplied to the substrate, a substrate to be treated is charged by the treatment liquid or the treatment liquid is discharged to damage the substrate.

Further, when the treatment liquid having the large charging amount also circulates the flow path within the substrate treating apparatus, various sensors (e.g., a temperature sensor or a pressure sensor) installed on the flow path may malfunction or fail. The sensors are used for managing and maintaining a treating condition of the substrate, for example. Therefore, the malfunction and the failure of the sensor cause a bad treatment of the substrate.

Accordingly, the charging amount of the treatment liquid needs to be monitored in order to solve a static electricity problem which occurs during a substrate treating process.

SUMMARY OF THE INVENTION

An object of the present invention is to provide an apparatus for treating a substrate and a method for treating a substrate and an electrostatic monitoring method of a treatment liquid which can monitor a charging amount of a treatment liquid supplied to a substrate.

An object of the present invention is to provide an apparatus for treating a substrate and a method for treating a substrate and an electrostatic monitoring method of a treatment liquid which can prevent contamination of the treatment supplied to the substrate while measuring the charging amount of the treatment liquid.

The object to be achieved by the present invention is not limited to the aforementioned object, and other objects, which are not mentioned above, will be apparent to a person having ordinary skill in the art from the following description.

An exemplary embodiment of the present invention provides an apparatus for treating a substrate, which include: a substrate support unit supporting a substrate; a nozzle supplying a liquid to the substrate supported on the substrate support unit; a home port in which the nozzle waits; and an electrostatic measurement member measuring an electrostatic amount of a liquid dispensed from the nozzle in the home port.

Further, the electrostatic measurement member may include a first measurement electrode provided in the home port to be in contact with the liquid dispensed from the nozzle.

Further, the apparatus may further include a liquid supply device supplying the liquid to the nozzle, and the liquid supply device may include a vent unit venting the liquid, and the electrostatic measurement member may further include a second measurement electrode provided to be in contact with the liquid vented through the vent unit.

Further, the electrostatic measurement member may further include a voltmeter measuring between a potential difference between the first measurement electrode and the second measurement electrode.

Further, the liquid supply device may have an opening/closing valve on a flow path in which the liquid flows, and the voltmeter may measure a voltage change before and after opening the opening/closing valve.

Further, the liquid supply device may include a tank temporarily storing the liquid before being supplied to the nozzle, and a pump supplying the liquid stored in the tank to the nozzle, and the vent unit may include a first vent line to which the liquid is vented from the tank, and a second vent line to which the liquid is vented from the pump.

Further, the second measurement electrodes may be provided in each of the first vent line and the second vent line.

Further, the first vent line and the second vent line may include fitting portions, and the second measurement electrode may include an electrode layer provided on a surface contacting the liquid of the fitting portion.

Further, the first measurement electrode and the second measurement electrode may be provided with a porous material.

Further, the first measurement electrode and the second electrode may have a contact surface having an unevenness or a pattern in order to increase a contact area with the liquid.

Further, the first measurement electrode may include an electrode layer subjected to ion injection treatment or coating treatment on a body surface of the home port contacting the liquid dispensed from the nozzle.

Another exemplary embodiment of the present invention provides a method for monitoring an electrostatic amount in a substrate treating apparatus using a liquid in which in a home port in which a nozzle ejecting a liquid waits, an electrostatic amount of the liquid dispensed from the nozzle is measured to check a liquid electrostatic amount change in real time.

Further, an electrostatic amount of a liquid vented from a module provided on a liquid supply flow path supplying the liquid to the nozzle is measured to check the liquid electrostatic amount change in real time.

Further, in the home port, a potential difference between the liquid dispensed from the nozzle and the liquid vented from the module is measured.

Further, the module may include a pump and a tank.

Yet another exemplary embodiment of the present invention provides an apparatus for treating a substrate, which includes: a treating unit configured to liquid-treating a substrate; a home port provided outside the treating unit; a nozzle unit ejecting a treatment liquid to a substrate positioned in the treating unit, and having a nozzle provided to be movable between a process location at which the treating unit performs the liquid-treating for the substrate and a waiting location of waiting in the home port; a treatment liquid supply device supplying the treatment liquid to the nozzle, and having a tank and a pump; and an electrostatic measurement member measuring an electrostatic amount of a liquid dispensed from the nozzle which is waiting in the home port.

Further, the electrostatic measurement member may include a first measurement electrode provided in the home port to be in contact with the liquid dispensed from the nozzle, and a second measurement electrode installed in at least one of vent lines installed in the tank and the pump, respectively and provide to be in contact with a liquid vented from the vent line.

Further, the electrostatic measurement member may further include a voltmeter measuring between a potential difference between the first measurement electrode and the second measurement electrode.

Further, the first measurement electrode and the second measurement electrode may be provided with a porous material.

Further, the first measurement electrode and the second electrode may have a contact surface having an unevenness or a pattern in order to increase a contact area with the liquid.

According to an exemplary embodiment of the present invention, a charge amount of a treatment liquid supplied to a substrate can be monitored.

According to an exemplary embodiment of the present invention, the charging amount of the treatment liquid supplied to the substrate can be prevented while measuring the charging amount of the treatment liquid.

The effect of the present invention is not limited to the foregoing effects, and non-mentioned effects will be clearly understood by those skilled in the art from the present specification and the accompanying drawings.

DETAILED DESCRIPTION

Figure 1:
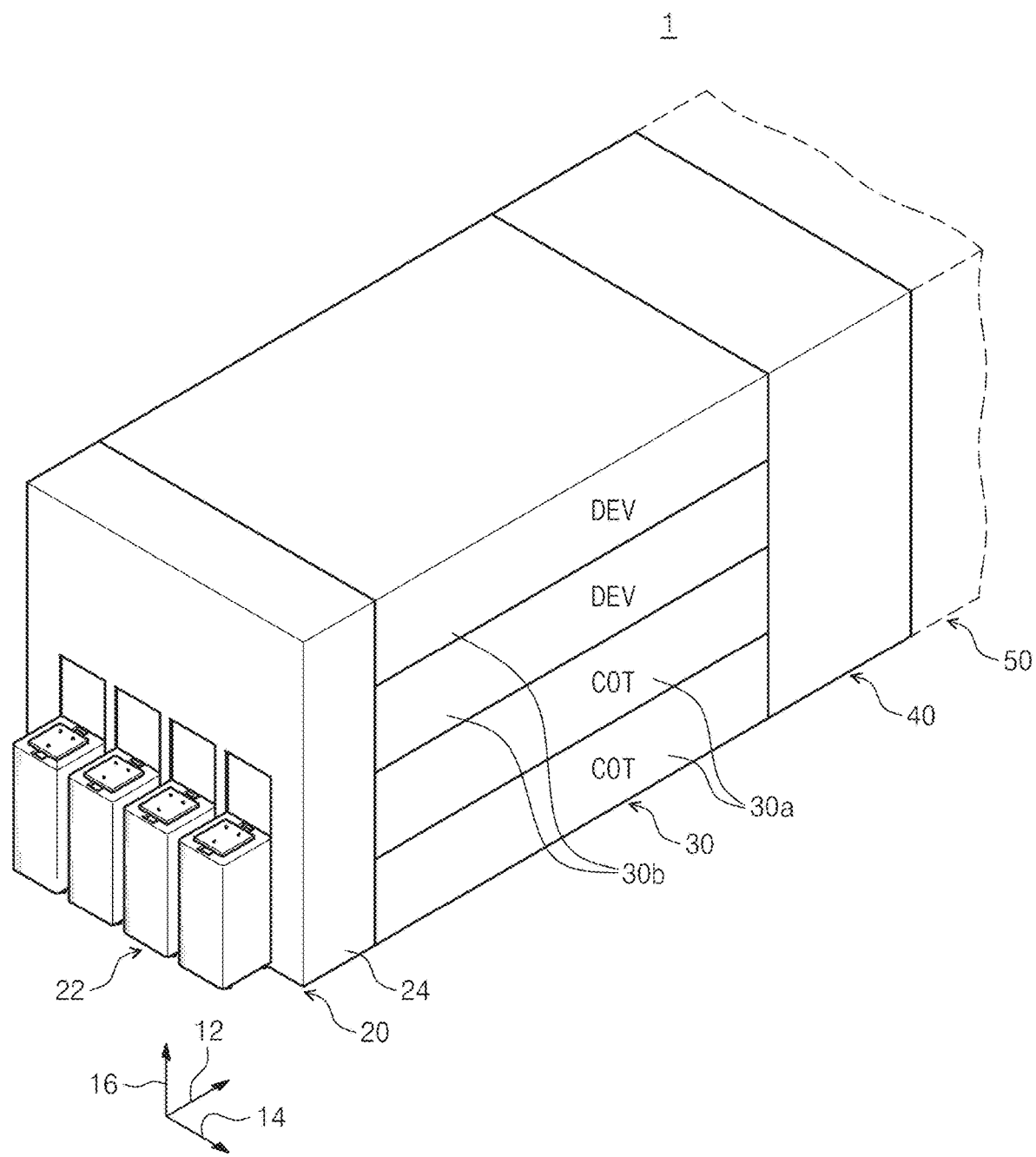
FIG. 1 is a perspective view schematically illustrating an apparatus for treating a substrate according to an exemplary embodiment of the present invention.

In the following detailed description, embodiments of the present invention have been shown and described, simply by way of illustration. As those skilled in the art would realize, the described embodiments may be modified in various different ways, all without departing from the spirit or scope of the present invention. In the following description of the present invention, a detailed description of known functions and configurations incorporated herein is omitted to avoid making the subject matter of the present invention unclear. Further, the same reference numeral is used for a part which performs a similar function and a similar action through all drawings.

Unless explicitly described to the contrary, the word "include" and variations such as "includes" or "including" will be understood to imply the inclusion of stated elements but not the exclusion of any other elements. In the present application, it should be understood that term "include" or "have" indicates that a feature, a number, a step, an operation, a component, a part or the combination thereof described in the specification is present, but does not exclude a possibility of presence or addition of one or more other features, numbers, steps, operations, components, parts or combinations thereof, in advance.

A singular form includes a plural form if there is no clearly opposite meaning in the context. Further, shapes, sizes, and the like of elements in the drawings may be exaggerated for clearer explanation.

Terms including as first, second, and the like are used for describing various components, but the components should not be limited by the terms. The terms are used only for distinguishing one component from the other component. For example, a first component may be referred to as a second component, and similarly, the second component may be referred to as the first component without departing from the scope of the present invention.

It should be understood that, when it is described that a component is "connected to" or "accesses" another component, the component may be directly connected to or access the other component or another component may be present therebetween. In contrast, it should be understood that, when it is described that a component is "directly connected to" or "directly access" another component, no component is present between the component and another component. Meanwhile, other expressions describing the relationship of the components, that is, expressions such as "between" and "directly between" or "adjacent to" and "directly adjacent to" should be similarly interpreted.

If it is not contrarily defined, all terms used herein including technological or scientific terms have the same meanings as those generally understood by a person with ordinary skill in the art. Terms which are defined in a generally used dictionary should be interpreted to have the same meaning as the meaning in the context of the related art, and are not interpreted as an ideal meaning or excessively formal meanings unless clearly defined in the present application. The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed embodiment. Further, the accompanying claims should be construed to include other exemplary embodiments as well.

Figure 2:
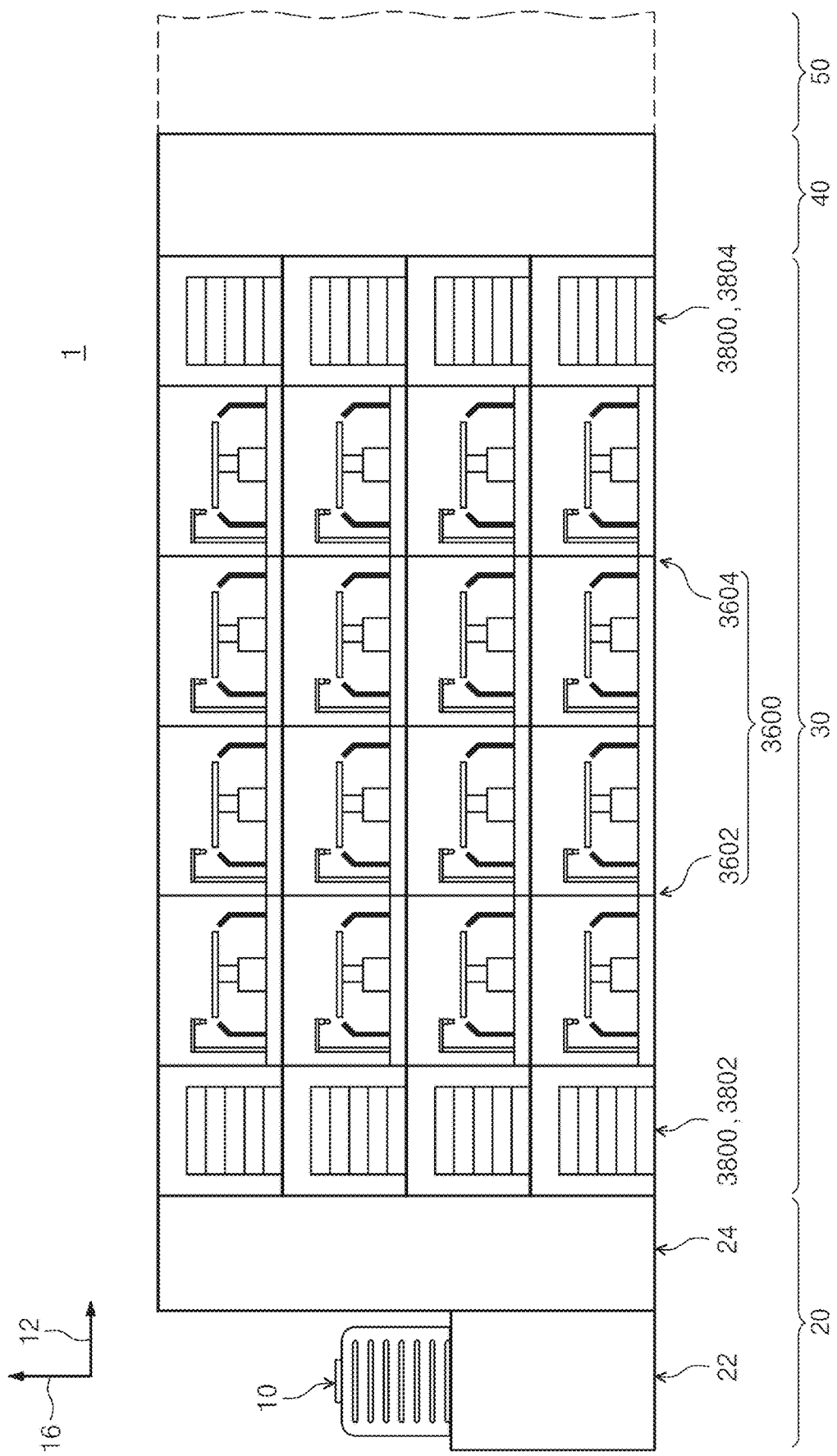
FIG. 2 is a cross-sectional view of the apparatus for treating a substrate illustrating an application block or a development block in FIG. 1.
Figure 3:
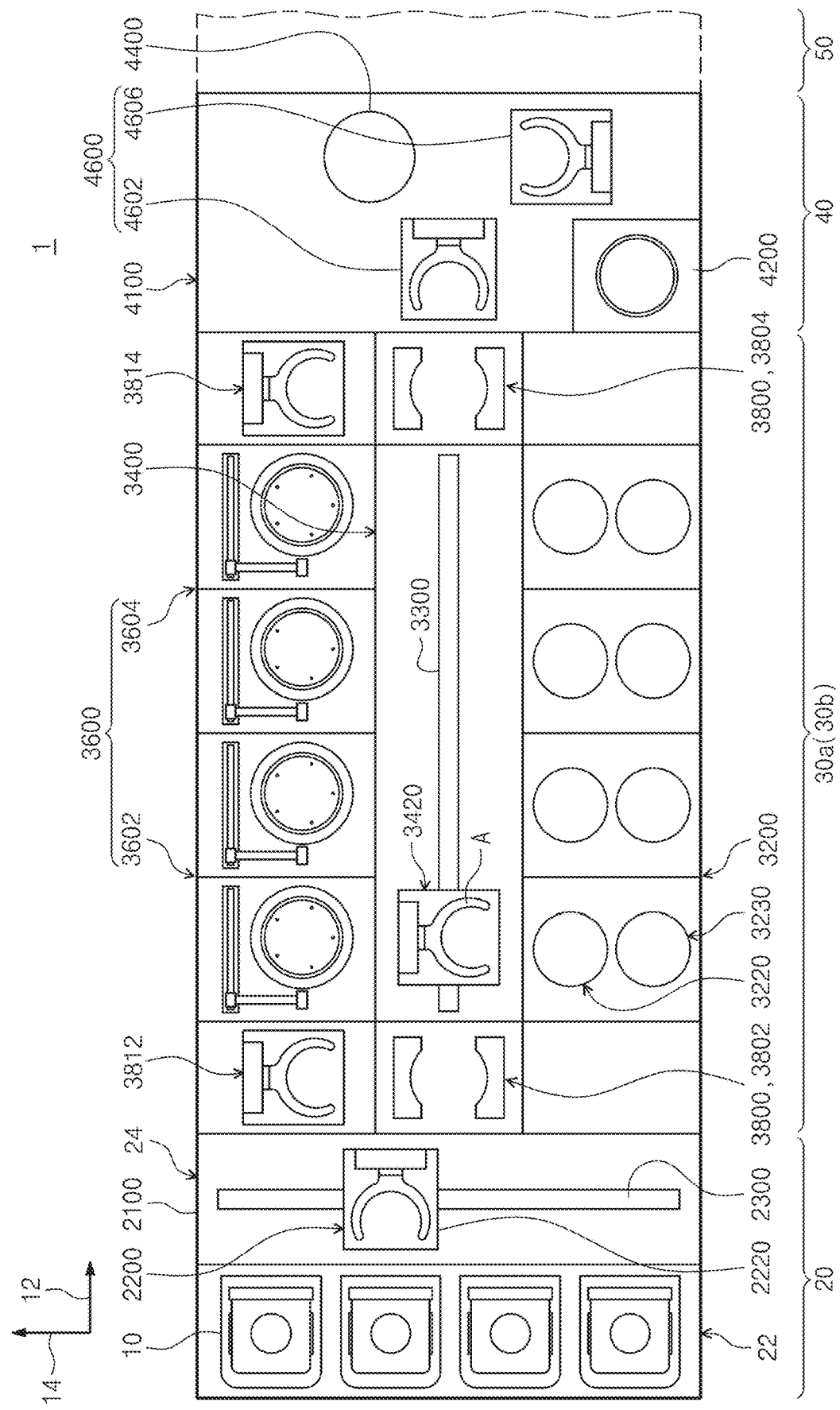
FIG. 3 is a plan view of the apparatus for treating a substrate in FIG. 1.

FIG. 1 is a perspective view schematically illustrating an apparatus for treating a substrate according to an exemplary embodiment of the present invention, FIG. 2 is a cross-sectional view of the apparatus for treating a substrate illustrating an application block or a development block in FIG. 1, and FIG. 3 is a plan view of the apparatus for treating a substrate in FIG. 1.

Referring to FIGS. 1 to 3, the substrate treating apparatus 1 includes an index module 20, a treating module 30, and an interface module 40. According to an exemplary embodiment, the index module 20, the treating module 30, and the interface module 40 are sequentially arranged in line. Hereinafter, a direction in which the index module 20, the treating module 30, and the interface module 40 are arranged will be defined as an X-axis direction 12, a direction vertical to the X-axis direction 12 when viewed from the top will be defined as a Y-axis direction 14, and a direction vertical to both the X-axis direction 12 and the Y-axis direction 14 will be defined as a Z-axis direction 16.

The index module 20 transfers the substrate W to the treating module 30 from a container 10 storing the substrate W and stores the substrate W of which treating is completed in the container 10. A longitudinal direction of the index module 20 is provided as the Y-axis direction 14. The index module 20 has a load port 22 and an index frame 24. The load port 22 is positioned at an opposite side to the treating module 30 based on the index frame 24. The container 10 storing the substrates W is placed in the load port 22. A plurality of load ports 22 may be provided, and the plurality of load ports 22 may be arranged in the Y-axis direction 14.

A sealing container 10 such as a front opening unified pod (FOUP) may be used as the container 10. The container 10 may be placed on the load port 22 by a transportation means (not illustrated) such as an overhead transfer, an overhead conveyor, or an automatic guided vehicle or a worker.

An index robot 2200 is provided inside the index frame 24. A guide rail 2300 in which a longitudinal direction is provided as the Y-axis direction 14 may be provided inside the index frame 24, and the index robot 2200 may be provided to be movable on the guide rail 2300. The index robot 2200 may include a hand 2220 on which the substrate W is placed, and the hand 2220 may be provided to be movable forward and backward, rotatable with the Z-axis direction 16 as an axis and movable in the Z-axis direction 16.

The treating module 30 may perform an application process and a development process for the substrate W. The treating module 30 has an application block 30a and a development block 30b. The application block 30a performs an application process for the substrate W and the development block 30b performs a development process for the substrate W. A plurality of application blocks 30a is provided and the application blocks 30a are provided to be laminated on each other. A plurality of development blocks 30b is provided and the development blocks 30b are provided to be laminated on each other. According to an exemplary embodiment of FIG. 3, two application blocks 30a are provided and two development blocks 30b are provided. The application blocks 30a may be arranged below the development blocks 30b. According to an example, two application blocks 30a may perform the same process and may be provided in the same structure. Further, two development blocks 30b may perform the same process and may be provided in the same structure.

Referring to FIG. 3, the application block 30a includes a heat treating chamber 3200, a transfer chamber 3400, a liquid treating chamber 3600, and a buffer chamber 3800. The heat treating chamber 3200 performs a heat treating process for the substrate W. The heat treating process may include a cooling process and a heating process. The heat treating chamber 3600 forms a liquid layer by supplying the liquid onto the substrate W. The liquid layer may be a photoresist layer or an anti-reflective layer. The transfer chamber 3400 transfers the substrate W between the heat treating chamber 3200 and the liquid treating chamber 3600 in the application block 30a.

The longitudinal direction of the transfer chamber 3400 is provided in parallel to the X-axis direction 12. A transfer unit 3420 is provided in the transfer chamber 3400. The transfer unit 3420 transfers the substrate among the heat treating chamber 3200, the liquid treating chamber 3600o, and the buffer chamber 3800. According to an example, the transfer unit 3420 may include a hand A on which the substrate W is placed, and the hand A may be provided to be rotatable with the Z-axis direction 16 as the axis, and movable in the Z-axis direction 16. The guide rail 3300 in which the longitudinal direction is provided in parallel to the X-axis direction 12 may be provided inside the transfer chamber 3400, and the transfer unit 3420 may be provided to be movable on the guide rail 3300.

A plurality of liquid treating chambers 3600 is provided. Some of the liquid treating chambers 3600 may be provided to be stacked on each other. The liquid treating chambers 3600 are arranged at one side of the transfer chamber 3402. The heat treating chambers 3600 are arranged in line in the X-axis direction 12. Some of the liquid treating chambers 3600 are provided at locations adjacent to the index module 20. Hereinafter, the liquid treating chambers will be referred as a front liquid treating chamber 3602. Other some of the liquid treating chambers 3600 are provided at locations adjacent to the interface module 40.

Hereinafter, the liquid treating chambers will be referred as a rear liquid treating chamber 3604. The front liquid treating chamber 3602 applies a first liquid onto the substrate W and the rear liquid treating chamber 3604 applies a second liquid onto the substrate W. The first liquid and the second liquid may be different types of liquids. According to an exemplary embodiment, the first liquid is the anti-reflective layer and the second liquid is the photoresist. The photoresist may be applied to the substrate W to which the anti-reflective layer is applied. Optionally, the first liquid may be the photoresist and the second liquid may be the anti-reflective layer. In this case, the anti-reflective layer may be applied onto the substrate W to which the photoresist is applied. Optionally, the first liquid and the second liquid may be the same type of liquids, and both the first liquid and the second liquid may be the photoresist.

Figure 4:
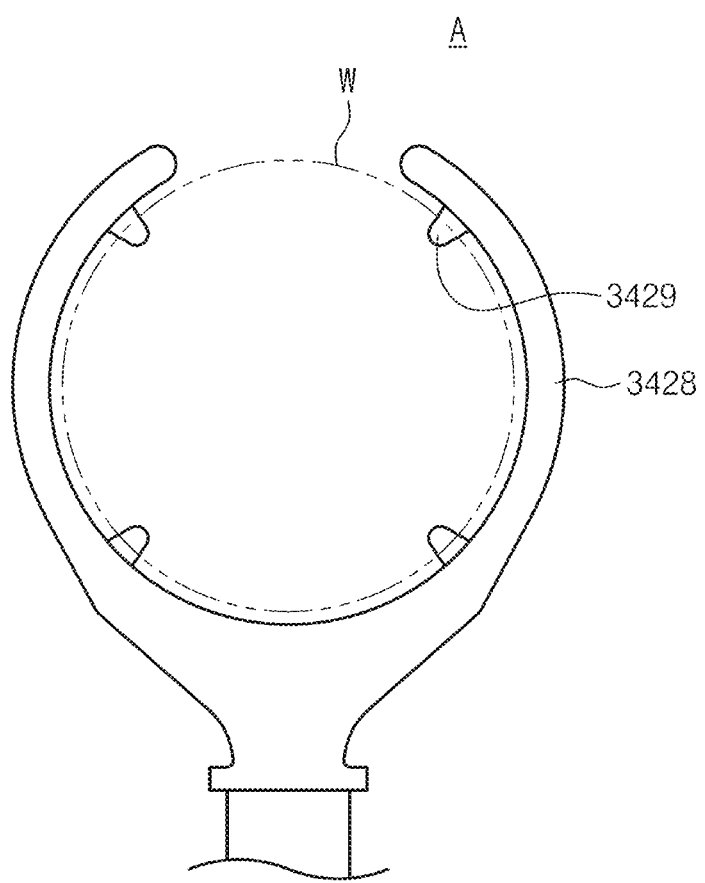
FIG. 4 is a diagram illustrating an example of a hand of a transfer unit in FIG. 3.

FIG. 4 is a diagram illustrating an example of a hand of a transfer unit in FIG. 3. Referring to FIG. 4, the hand A includes a base 3428 and a support protrusion 3429. The base 3428 may have the annular ring shape in which a part of the circumference is cut away. The base 3428 has an inner diameter larger than a diameter of the substrate W. The support protrusion 3429 extends inward from the base 3428. A plurality of support protrusion 3429 is provided, and supports an edge region of the substrate W. According to an example, four support protrusions 3429 may be provided at an equal interval.

Referring back to FIG. 2, a plurality of buffer chambers 3800 is provided. Some of the buffer chambers 3800 are arranged between the index module 20 and the transfer chamber 3400. Hereinafter, the buffer chamber will be referred to as a front buffer 3802. A plurality of front buffers 3802 is provided and arranged to be stacked on each other in a vertical direction. Other some of the buffer chambers 3802 are arranged between the transfer chamber 3400 and the interface module 40. Hereinafter, the buffer chambers will be referred to as a rear buffer 3804. A plurality of rear buffers 3804 is provided and arranged to be stacked on each other in the vertical direction. Each of the front buffers 3802 and the rear buffers 3804 temporarily keeps a plurality of substrates W. The substrate W kept in the front buffer 3802 is loaded or unloaded by the index robot 2200 and the transfer unit 3420. The substrate W kept in the rear buffer 3804 is loaded or unloaded by the transfer unit 3420 and a first robot 4602.

The development block 30*b* includes a heat treating chamber 3200, a transfer chamber 3400, and a liquid treating chamber 3600. The heat treating chamber 3200, the transfer chamber 3400, and the liquid treating chamber 3600 of the development block 30*b* are provided in a substantially similar structure and layout to the heat treating chamber 3200, the transfer chamber 3400, and the liquid treating chamber 3600 of the application block 30*a*, so a description thereof is omitted. However, in the development block 30*b*, all of the liquid treating chambers 3600 are equally provided to the development chamber 3600 that supplies a development liquid and performs a development treatment for the substrate.

The interface module 40 connects the treating module 30 to an external exposure apparatus 50. The interface module 40 includes an interface frame 4100, an additional process chamber 4200, an interface buffer 4400, and a transfer member 4600.

A fan filter unit forming a descending air flow therein may be provided at an upper end of the interface frame 4100. The additional process chamber 4200, the interface buffer 4400, and the transfer member 4600 are disposed inside the interface frame 4100. The additional process chamber 4200 may perform a predetermined additional process before the substrate W of which the process is completed in the application block 30*a* is loaded on the exposure apparatus 50. Optionally, the additional process chamber 4200 may perform a predetermined additional process before the substrate W of which the process is completed in the exposure apparatus 50 is loaded on the development block 30*b*.

According to an example, the additional process may be an edge exposure process of exposing the edge region of the substrate W, a top surface cleaning process of cleaning the top surface of the substrate W, or a bottom surface cleaning process of cleaning the bottom surface of the substrate W. A plurality of additional process chambers 4200 may be provided and provided to be stacked on each other. All of the additional process chambers 4200 may be provided to perform the same process.

Optionally, some of the additional process chambers 4200 may be provided to perform different processes.

The interface buffer 4400 provides a space in which the substrate W transferred among the application block 30*a*, the additional process chamber 4200, the exposure apparatus 50, and the development block 30*b* temporarily stays in the middle of the transfer. A plurality of interface buffers 4400 may be provided and the plurality of interface buffers 4400 may be provided to be stacked on each other.

According to an example, the additional process chamber 4200 may be arranged on one side surface based on an extension line of the longitudinal direction of the transfer chamber 3400, and the interface buffer 4400 may be arranged on the other side surface.

The transfer member 4600 transfers the substrate W among the application block 30*a*, the additional process chamber 4200, the exposure apparatus 50, and the development block 30*b*. The transfer member 4600 may be provided as one or a plurality of robots. According to an example, the transfer member 4600 includes a first robot 4602 and a second robot 4606. The first robot 4602 may be provided to transfer the substrate W among the application block 30*a*, the additional process chamber 4200, and the interface buffer 4400, the interface robot 4606 may be provided to transfer the substrate W between the interface buffer 4400 and the exposure apparatus 50, and the second robot 4604 may be provided to transfer the substrate W between the interface buffer 4400 and the development block 30*b*.

Each of the first robot 4602 and the second robot 4606 may include a hand on which the substrate W is placed, and the hand may be provided to be rotatable based on an axis parallel to the Z-axis direction 16 and movable in the Z-axis direction 16.

Referring back to FIGS. 2 and 3, a plurality of heat treating chambers 3200 is provided. The heat treating chambers 3200 are arranged to be listed in the X-axis direction 12. The heat treating chambers 3200 are positioned at one side of the transfer chamber 3400.

Figure 5:
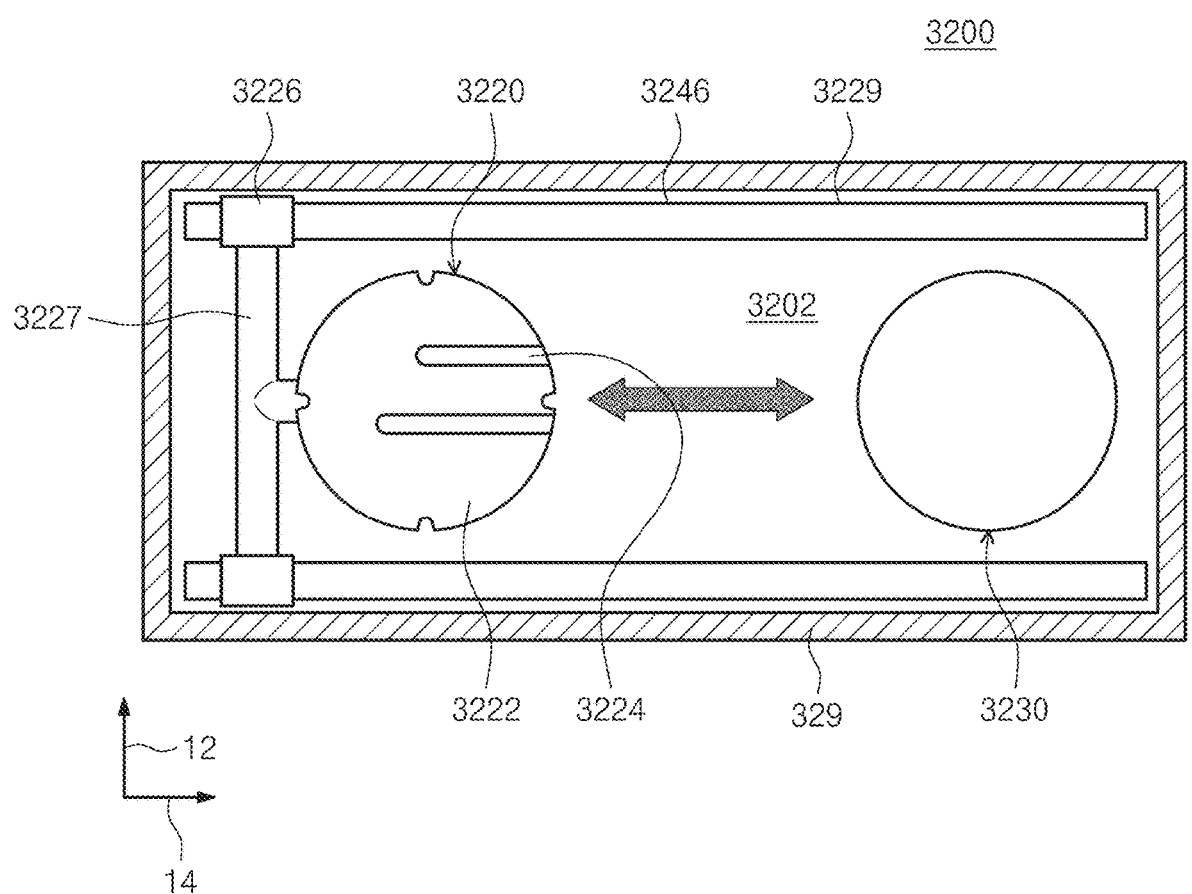
FIG. 5 is a plan cross-sectional view schematically illustrating an example of a heat treating chamber in FIG. 3.
Figure 6:
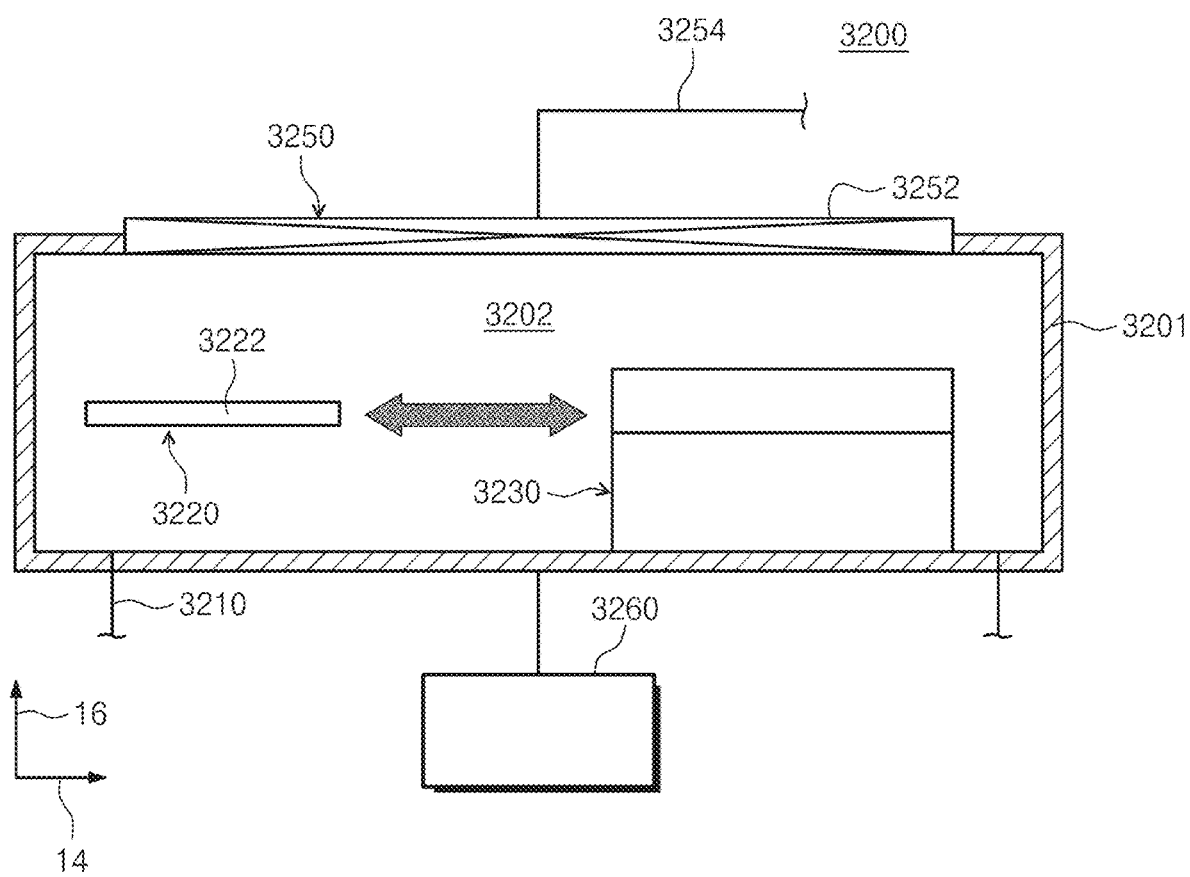
FIG. 6 is a front cross-sectional view of the heat treating chamber in FIG. 5.

FIG. 5 is a plan cross-sectional view schematically illustrating an example of a heat treating chamber in FIG. 3 and FIG. 6 is a front cross-sectional view of the heat treating chamber in FIG. 5.

Referring to FIGS. 5 and 6, the heat treating chamber 3200 includes a treating housing 3201, a cooling unit 3220, and a heating unit 3230.

The treating housing 3201 has an internal space 3202. The treating housing 3201 is provided in a substantially rectangular parallelepiped shape. An entrance (not illustrated) through which the substrate W enters and exits is formed on a side wall of the treating housing 3201. Further, a door (not illustrated) may be provided to open/close the entrance. The entrance may be maintained in a selectively opened state. The entrance may be formed in a region adjacent to the cooling unit 3220.

The cooling unit 3220 and the heating unit 3230 are provided within the internal space 3202 of the treating housing 3201. The cooling unit 3220 and the heating unit 3230 are provided in line in the Y-axis direction 14.

The treating housing 3201 may be connected to an exhaust line 3210. The exhaust line 3210 may exhaust gas supplied by a fan unit 3250 to the outside of the treating housing 3201. The exhaust line 3210 may be connected to a lower portion of the treating housing 3201. However, the present invention is not limited thereto, and the exhaust line 3210 may be connected to a side portion of the treating housing 3201.

The cooling unit 3220 includes a cooling plate 3222. The substrate W may be seated on the cooling plate 3222. The cooling plate 3222 may have a shape close to a substantially circular shape when viewed from the top. A cooling member (not illustrated) may be supplied in the cooling plate 3222. According to an example, the cooling member may be formed inside the cooling plate 3222 and provided as a flow path in which a cooling fluid flows. Therefore, the cooling plate 3222 may cool the substrate W. The cooling plate 3222 may have a diameter corresponding to the substrate W. A notch may be formed on an edge of the cooling plate 3222. The notch may have a shape corresponding to the support protrusion 3429 formed in the hand A. Further, the notch may be provided with a number corresponding to the number of support protrusions 3429 formed in the hand A, and formed at a location corresponding to the support protrusion 3429. When vertical locations of the hand A and the cooling plate 3222 are changed, the substrate W is transferred between the hand A and the cooling plate 3222. A plurality of slit-shaped guide grooves 3222 is provided in the cooling plate 3222. The guide groove 3224 extends from an end of the cooling plate 3222 to an inside of the cooling plate 3222. A longitudinal direction of the guide groove 3224 is provided in the Y-axis direction 14, and the guide grooves 3224 are positioned spaced apart from each other in the X-axis direction 12. The guide groove 3224 prevents the cooling plate 3222 and the lift pin 3236 from interfering with each other when the substrate W is changed over between the cooling plate 3222 and the heating unit 3230.

The cooling plate 3222 may move in the Y-axis direction 14 by a driver 3226 mounted on the guide rail 3229.

Figure 7:
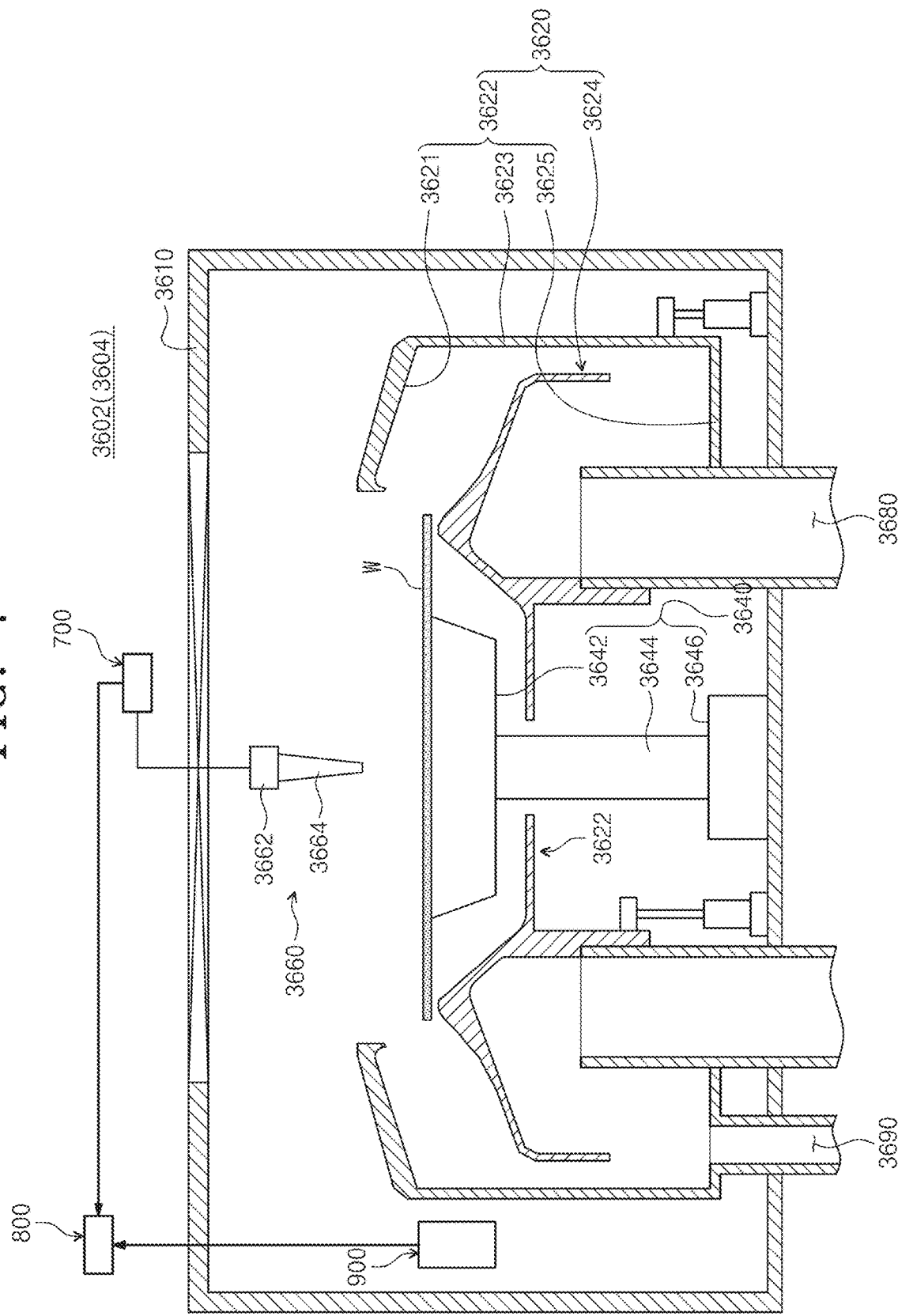
FIG. 7 is a diagram schematically illustrating an example of a liquid treating chamber in FIG. 3.

The heating unit 3230 is provided as an apparatus 1000 that heats the substrate to a temperature higher than the room temperature. The heating unit 3230 heats the substrate W at a normal pressure or a decompression atmosphere lower than the constant pressure. FIG. 7 is a diagram schematically illustrating an example of a liquid treating chamber in FIG. 3.

Referring to FIGS. 3 and 7, each substrate treating unit 3602 performs an application process of applying a treatment liquid such as a photosensitive liquid onto the substrate W. The substrate treating units may be sequentially arranged in the first direction 12. For example, three substrate treating units may be positioned within a housing 3610.

Each substrate treating unit 3602 includes a substrate support unit 3640, a treating housing 3620, a liquid supply unit 700, an electrostatic measurement member 800, and a home port 900. The substrate support unit 3640 supports the substrate W in the internal space of the housing 3610. The substrate support unit 3640 rotates the substrate W. The substrate support unit 3640 includes a spin chuck 3642, a rotation axis 3644, and a driver 3646. The spin chuck 3642 is provided to a substrate support member 3642 supporting the substrate. The spin chuck 3642 is provided to have a circular plate shape. The substrate W is in contact with a top surface of the spin chuck 3642.

The rotation axis 3644 and the driver 3646 are provided to rotation driving members 3644 and 3646 that rotate the spin chuck 3642. The rotation axis 3644 supports the spin chuck 3642 below the spin chuck 3642. The rotation axis 3644 is provided toward the vertical direction which is the longitudinal direction thereof. The rotation axis 3644 is provided to be rotatable around the central axis. The driver 3646 provides driving force so as to rotate the rotation axis 3644.

The treating housing 3620 is positioned in the internal space of the housing 3610. The treating housing 3620 may have a cup shape of which an upper portion is opened. The treating housing 3620 provides the treating space therein. The treating housing 3620 is provided to cover the circumference of the substrate support unit 3640. That is, the substrate support unit 3640 is positioned in the treating space. The treating housing 3620 has an outer cup 3622 and an inner cup 3624. The outer cup 3622 is provided to cover the circumference of the substrate support unit 3640 and the inner cup 3624 may be positioned inside the outer cap 3622. Each of the outer cup 3622 and the inner cup 3624 is provided in an annular ring shape. A space between the outer cup 3622 and the inner cup 3624 serves as a recovery path in which the liquid is recovered.

The nozzle unit 3660 supplies the treatment liquid onto the substrate W. The nozzle unit 3660 includes an arm 3662 and a treating nozzle 3664. The treating nozzle 3664 is installed on a bottom of the arm 3662. Optionally, a plurality of arms 3622 may be provided, and the treating nozzle 3664 may be installed in each of the arms 3662. Further, the arm 3662 may be rotated while being coupled to a rotation axis (not illustrated) of which longitudinal direction faces the third direction.

The treating nozzle 3644 moves between the process location and the waiting location by rotation of the rotation axis. At the process location, the treating nozzle 3664 ejects the treatment liquid to the substrate supported on the substrate support unit 3640 to perform liquid-treatment for the substrate. While the liquid-treatment is not conducted for the substrate, the treating nozzle 4366 waits at the waiting location.

The treating nozzle 3664 may perform an auto-dispense operation, a pre-dispense operation, and a nozzle cleaning operation while being positioned in the home port 900 which is the waiting location. The auto-dispense operation is an operation of ejecting the treatment liquid at a predetermined time interval when the treating nozzle 3664 waits at the waiting location for a long time. The treatment liquid is prevented from being solidified in the nozzle unit 3660 by the auto-dispense operation. The pre-dispense operation is an operation of previously ejecting the treatment liquid at the waiting location before ejecting the treatment liquid to the substrate from the treating nozzle 3664. The treatment liquid is smoothly ejected at the time of ejecting the treatment liquid to the substrate by the pre-dispense operation.

The home port 900 is placed outside the cup 3620. When viewed from the top, the waiting location of the treating nozzle 3664 is overlapped with the home port 900.

The liquid supply unit 700 supplies the treatment liquid to the treating nozzle 3664. In the exemplary embodiment, it is described that the liquid supply unit 700 supplies the resist liquid used for the application process, but the present invention is not limited thereto, and the liquid supply unit 700 is applicable to all liquid treating apparatuses that treat the substrate surface by using the treatment liquid.

Figure 8:
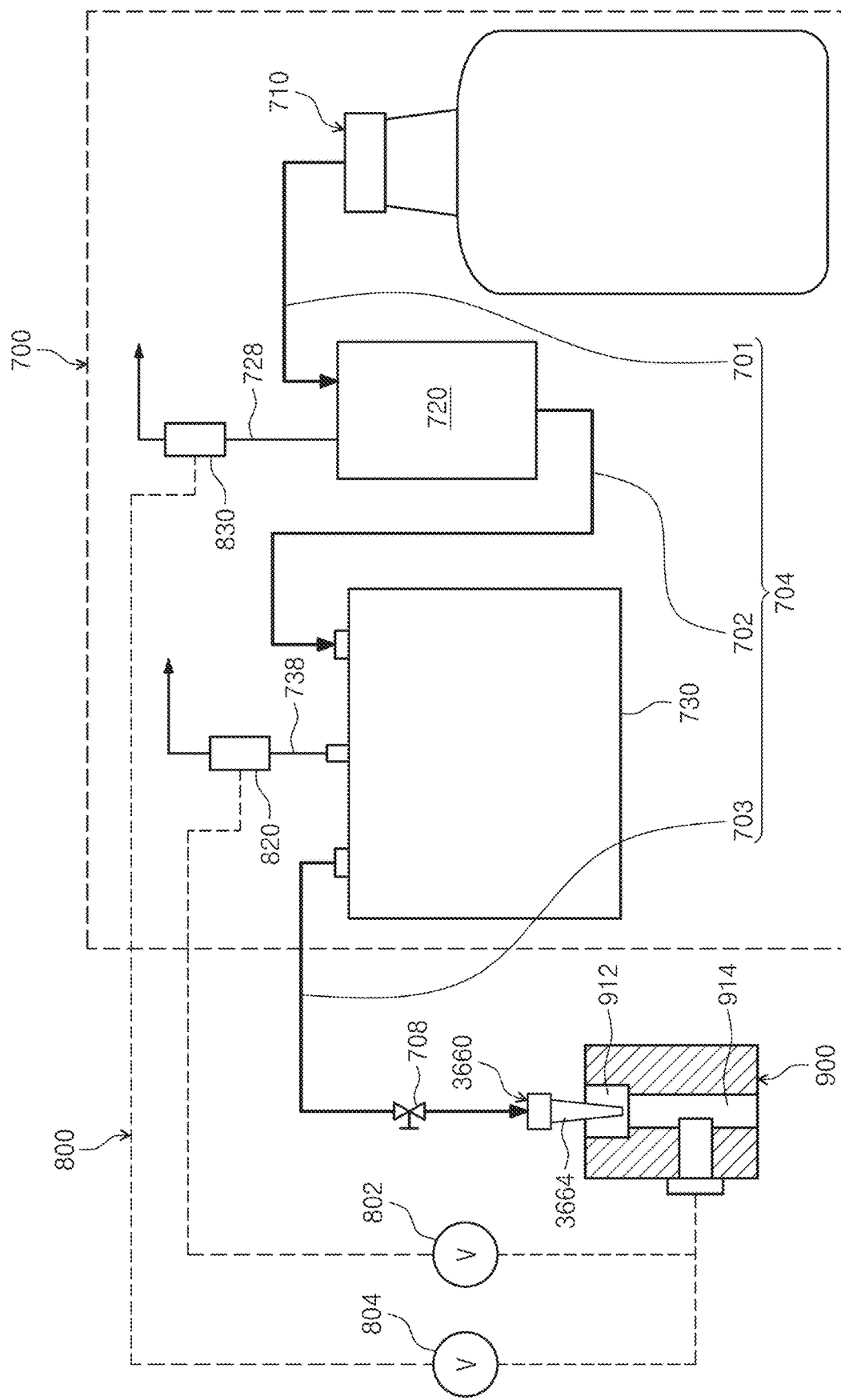
FIG. 8 is a diagram for describing a liquid supply unit, a home port, and an electrostatic measurement member illustrated in FIG. 7.

FIG. 8 is a diagram for describing a liquid supply unit, a home port, and an electrostatic measurement member illustrated in FIG. 7.

The home port 900 provides a cylindrical shaped accommodation space 912 having an upper portion of a body which is opened and capable of accommodating the nozzle tip of the treating nozzle 3664 therein, and an ejection space 914 to which the treatment liquid is dispensed from the treating nozzle 3664.

The liquid supply unit 700 may include a bottle 710, a trap tank 720, a pump unit 730, and a supply flow path 904.

The bottle 710 is filled with the treatment liquid, and a first supply line 701 is connected to an inert gas supply line (not illustrated). Inert gas (helium gas or nitrogen gas) is supplied to the bottle 710 through a regulator in order to make an inside of the bottle 710 through an inert gas supply line, and the internal treatment liquid is moved to the trap tank 720 through the first supply line 701 by a relative pressure.

In the trap tank 720, dissolved gas in the treatment liquid may be removed and separated. A second supply line 702 is connected to the trap tank 720. The second supply line 702 is connected to a pump unit 730. A first vent line 728 is connected to the trap tank 920. Some of the treatment liquid stored in the trap tank 920 may be discharged through the first vent line 728.

The pump unit 730 supplies the treatment liquid stored in the trap tank 720 to the treating nozzle 3664 by a flow pressure generated by suction and discharge operations. Third supply lines 703 are connected to the pump unit 730. The third supply line 703 may be connected to the treating nozzles 3664 of the respective liquid treating apparatuses. An opening/closing valve 708 may be provided in the third supply line 703. A second vent line 738 may be provided in the pump unit 730. Some of the treatment liquid pumped from the pump unit 730 may be discharged through the second vent line 738.

A supply flow path 704 may include the first supply line 701, the second supply line 702, and the third supply line 703.

The electrostatic measurement member 800 measures an electrostatic amount of the treatment liquid which flows in the liquid supply unit 700. The electrostatic measurement member 800 may measure the electrostatic amount of the treatment liquid which is dispensed and abandoned from the treating nozzle 3664 in the home port 900. Further, the electrostatic measurement member 800 may measure the electrostatic amount of the treatment liquid discharged through the first vent line 728 and the second vent line 738. Further, the electrostatic measurement member 800 may measure a potential difference between the treatment liquid which is dispensed in the home port 900 and the treatment liquid discharged through the vent lines 728 and 738.

According to an exemplary embodiment, the electrostatic measurement member 800 may include a first measurement electrode 810, second measurement electrodes 820 and 830, and voltmeters 802 and 804. The first and second measurement electrodes 810, 820, and 830 may include a conductive material. Since the electrodes 810, 820, and 830 contact the treatment liquid which is abandoned from the liquid supply unit 700, contamination by the contact between the electrode and the treatment liquid need not be concerned.

The first measurement electrode 810 may be provided in the home port 900. The first measurement electrode 810 may be provided at a location capable of contacting the treatment liquid dispensed from the treating nozzle 3664. As an example, the first measurement electrode 810 may be provided on a side wall contacting an ejection space 914 of the home port 900.

The second measurement electrodes 820 and 830 may be provided in the first vent line 728 and the second vent line 738 through which the treatment liquid is vented. The second measurement electrodes 820 and 830 may be provided at locations capable of contacting the treatment liquid discharged through the vent lines 728 and 738.

The voltmeter 802 may measure the potential difference between the first measurement electrode 810 and the second measurement electrode 820. Another voltmeter 804 may measure the potential difference between the first measurement electrode 810 and the second measurement electrode 830. The voltmeters 802 and 804 may measure the voltage change before and after opening the opening/closing valve 708. A value measured in the electrostatic measurement member 800 may be provided to an operator.

Meanwhile, the voltmeter 802 may measure the voltage change between the first measurement electrode 810 and the second measurement electrodes 820 and 830 when flow paths through which the treatment liquid in the pump unit 730 passes are linked into one.

The electrostatic measurement member 800 may be provided to output an arm when the electrostatic amounts measured by the first measurement electrode 810 and the second measurement electrodes 820 and 830 exceed an appropriate range.

Since the first measurement electrode 810 and the second measurement electrodes 820 and 830 are not provided on the flow path of the treatment liquid provided to the substrate, the first measurement electrode 810 and the second measurement electrodes 820 and 830 are not exposed to the treatment liquid ejected to the substrate. Therefore, a problem in that foreign substances erupted from the measurement electrodes are ejected to the substrate jointly with the treatment liquid to contaminate the substrate is not caused.

Figure 9:
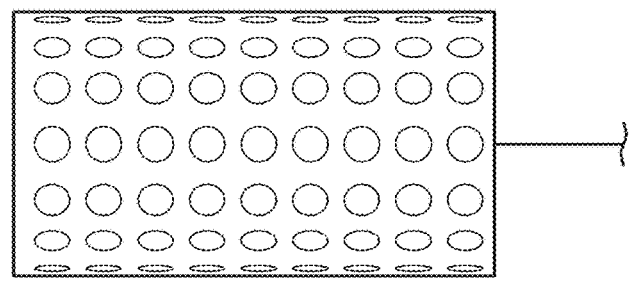
FIG. 9 is a diagram illustrating an example of a measurement electrode illustrated in FIG. 8.

FIG. 9 is a diagram illustrating an example of a measurement electrode illustrated in FIG. 8.

As illustrated in FIG. 9, the first and second measurement electrodes 810, 820, and 830 may be provided with the porous material.

Figure 10:
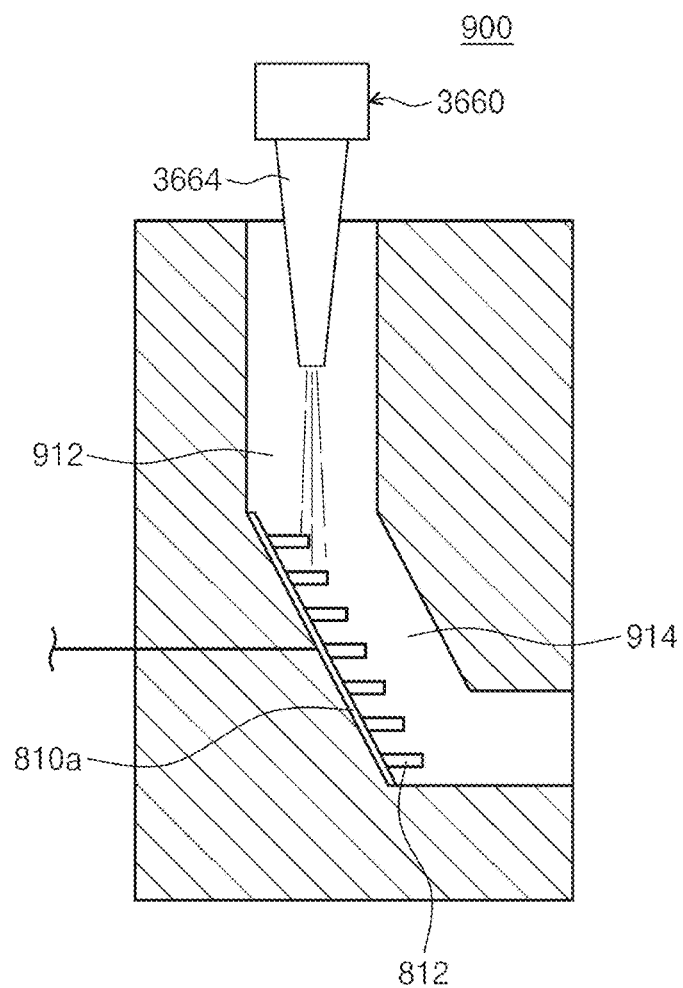
FIG. 10 is a diagram illustrating another example of a first measurement electrode installed in the home port.

FIG. 10 is a diagram illustrating another example of a first measurement electrode installed in the home port.

As illustrated in FIG. 10, a first measurement electrode 810a may include a contact surface having an unevenness 912 or a pattern on the surface in order to increase the contact area with the treatment liquid.

Figure 11:
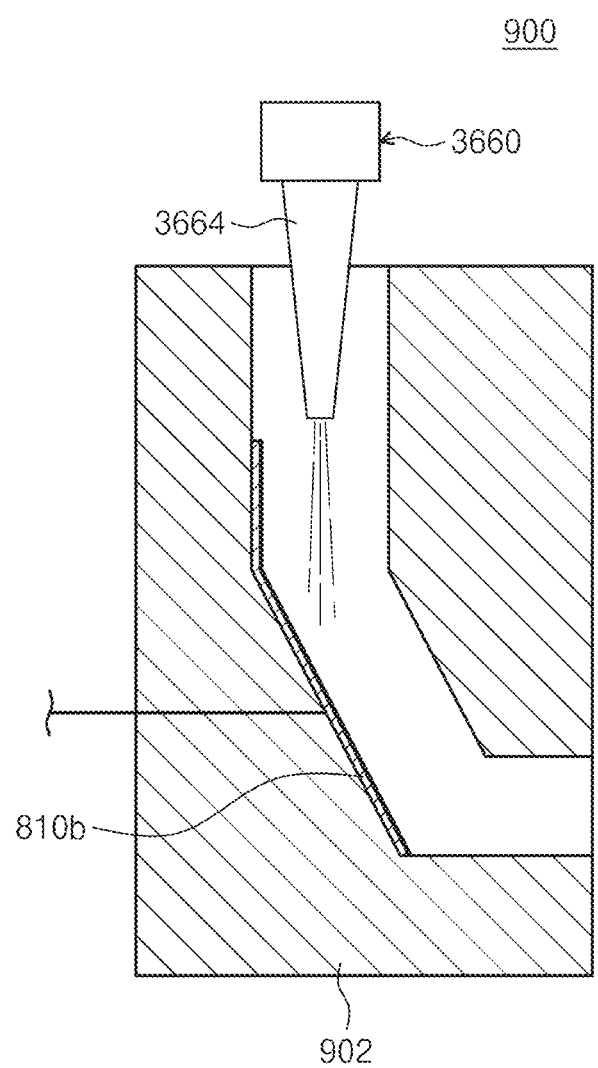
FIG. 11 is a diagram illustrating yet another example of the first measurement electrode installed in the home port.

FIG. 11 is a diagram illustrating yet another example of the first measurement electrode installed in the home port.

As illustrated in FIG. 11, a first measurement electrode 810b may be provided in the form of an electrode layer having conductivity. The electrode layer may be provided on the body surface of the home port 900 contacting the treatment liquid dispensed from the treating nozzle 3664 through ion injection treatment or coating treatment.

Figure 12:
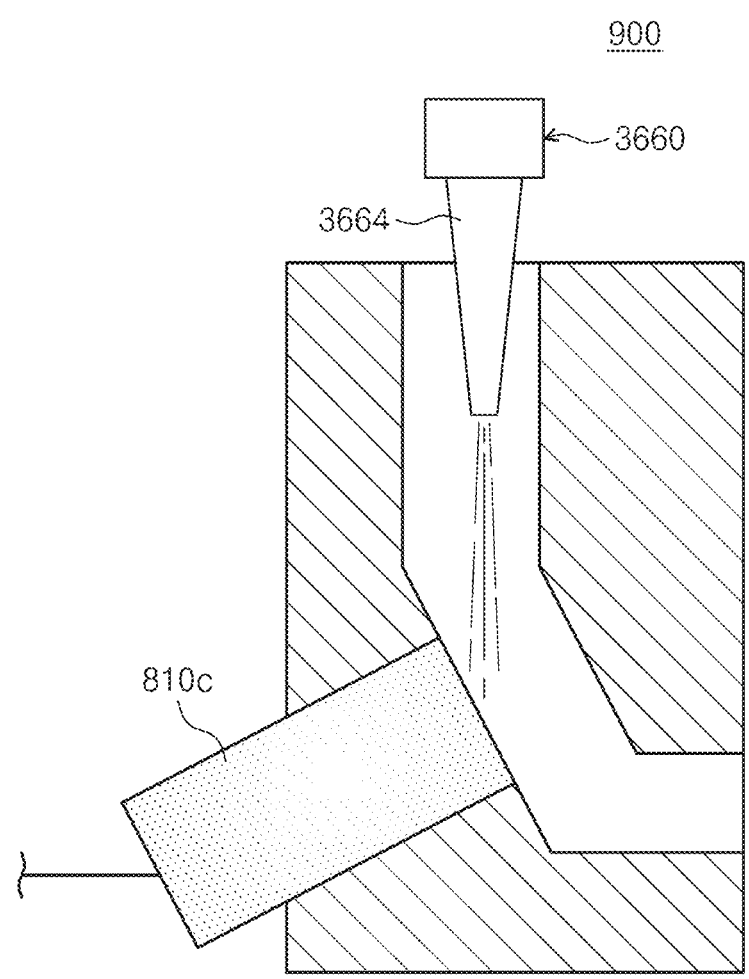
FIG. 12 is a diagram illustrating still yet another example of the first measurement electrode installed in the home port.

FIG. 12 is a diagram illustrating still yet another example of the first measurement electrode installed in the home port.

As illustrated in FIG. 12, a first measurement electrode 810c may have a surface provided in the form of a fitting tube into which ions are injected, and the first measurement electrode 810c may measure a conductive amount of the treatment liquid while being inserted into the body of the home port 900.

Figure 13:
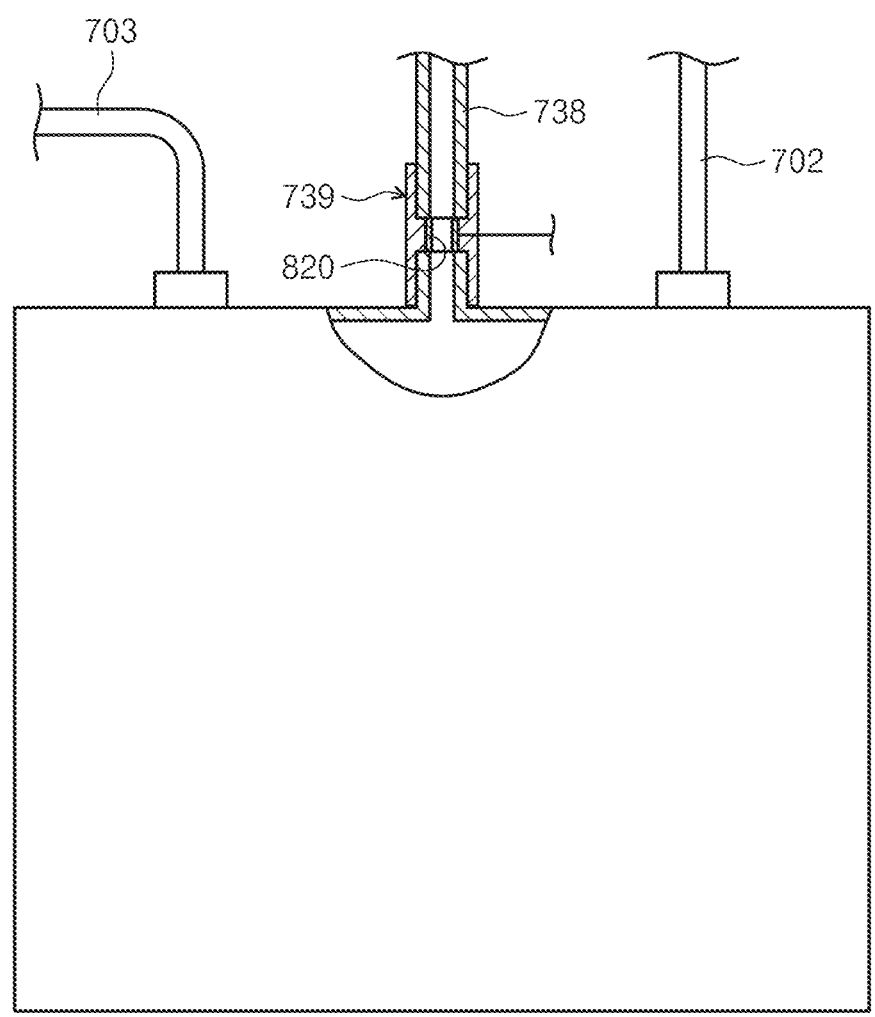
FIG. 13 is a diagram illustrating another example of a second measurement electrode installed on a vent line of a pump unit.

FIG. 13 is a diagram illustrating another example of a second measurement electrode installed on a vent line of a pump unit.

As illustrated in FIG. 13, the second measurement electrode 820 may be provided in the fitting portion 739 of the second vent line 738. The second measurement electrode 820 may be made into an electrode by performing ion injection treatment or coating treatment of the fitting portion 739.

The fitting portion 739 may be provided on the vent line 738 sufficiently spaced apart from the pump unit 700 in order to prevent a component (ion) erupted from the second measurement electrode 820 from being introduced into the pump unit 700 in the process in which the treatment liquid flows backward to the pump unit 700. The second measurement electrode provided in the fitting portion 739 may be equally applied even to the vent line of the trap tank. The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed embodiment. Further, the accompanying claims should be construed to include other exemplary embodiments as well.

What is claimed is:

1. An apparatus for treating a substrate, the apparatus comprising:
    a substrate support configured to support a substrate;
    a nozzle configured to supply a liquid to the substrate supported on the substrate support;
    a home port in which the nozzle waits; and
    an electrostatic measurement device configured to measure an electrostatic amount of the liquid dispensed from the nozzle in the home port,
    wherein the electrostatic measurement device includes
    a first measurement electrode provided in the home port to be in contact with a liquid dispensed from the nozzle, the first measurement electrode including an electrode layer subjected to ion injection treatment or coating treatment on a body surface of the home port contacting the liquid dispensed from the nozzle.

2. The apparatus of claim 1, further comprising:
    a liquid supplier device configured to supply the liquid to the nozzle,
    wherein the liquid supplier device includes a vent unit configured to vent the liquid, and
    the electrostatic measurement device further includes a second measurement electrode provided to be in contact with the liquid vented through the vent unit.

3. The apparatus of claim 2, wherein the electrostatic measurement device further includes a voltmeter configured to measure between a potential difference between the first measurement electrode and the second measurement electrode.

4. The apparatus of claim 2, wherein the liquid supplier has an opening/closing valve on a flow path in which the liquid flows, and
    the voltmeter is configured to measure a voltage change before and after opening the opening/closing valve.

5. The apparatus of claim 2, wherein the liquid supplier includes
    a tank configured to temporarily store the liquid before being supplied to the nozzle, and
    a pump configured to supply the liquid stored in the tank to the nozzle,
    the vent unit includes
    a first vent line to which the liquid is vented from the tank, and
    a second vent line to which the liquid is vented from the pump.

6. The apparatus of claim 5, wherein the second measurement electrode is provided in each of the first vent line and the second vent line.

7. The apparatus of claim 5, wherein the first vent line and the second vent line include fitting portions, and
    the second measurement electrode includes an electrode layer provided on a surface contacting the liquid of the fitting portions.

8. The apparatus of claim 2, wherein the first measurement electrode and the second measurement electrode are provided with a porous material.

9. The apparatus of claim 2, wherein the first measurement electrode and the second measurement electrode have a contact surface having an unevenness or a pattern in order to increase a contact area with the liquid.

10. An apparatus for treating a substrate, the apparatus comprising:
    a treating unit configured to liquid-treating a substrate;
    a home port provided outside the treating unit;
    a nozzle unit configured to eject a treatment liquid to a substrate positioned in the treating unit, and having a nozzle provided to be movable between a process location at which the treating unit performs the liquid-treating for the substrate and a waiting location of waiting in the home port;
    a treatment liquid supplier device configured to supply the treatment liquid to the nozzle, and having a tank and a pump; and
    an electrostatic measurement device configured to measure an electrostatic amount of the treatment liquid dispensed from the nozzle which is waiting in the home port,
    wherein the electrostatic measurement device includes:
    a first measurement electrode provided in the home port to be in contact with a liquid dispensed from the nozzle; and
    a second measurement electrode installed in at least one of vent lines installed in the tank and the pump, respectively and provided to be in contact with a liquid vented from the vent line.

11. The apparatus of claim 10, wherein the electrostatic measurement device further includes a voltmeter configured to measure a potential difference between the first measurement electrode and the second measurement electrode.

12. The apparatus of claim 10, wherein the first measurement electrode and the second measurement electrode are provided with a porous material.

13. The apparatus of claim 10, wherein the first measurement electrode and the second measurement electrode have a contact surface having an unevenness or a pattern in order to increase a contact area with the treatment liquid.

* * * * *